(12) United States Patent
Sugitatsu et al.

(10) Patent No.: US 6,865,197 B2
(45) Date of Patent: Mar. 8, 2005

(54) LASER DIODE MODULE

(75) Inventors: Atsushi Sugitatsu, Hyogo (JP); Tatsuo Hatta, Hyogo (JP); Satoshi Tamura, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 45 days.

(21) Appl. No.: 10/194,225

(22) Filed: Jul. 15, 2002

(65) Prior Publication Data

US 2003/0147435 A1 Aug. 7, 2003

(30) Foreign Application Priority Data

Feb. 4, 2002 (JP) ........................................ 2002-027073

(51) Int. Cl.[7] .................................................. H01S 3/13
(52) U.S. Cl. ...................................... 372/29.02; 372/32
(58) Field of Search ............................. 372/33, 36, 43, 372/20, 32, 31, 34, 29.01–29.023; 385/92, 93, 88

(56) References Cited

U.S. PATENT DOCUMENTS

| | | | | |
|---|---|---|---|---|
| 5,542,018 A | * | 7/1996 | Kuhara et al. | 385/92 |
| 5,546,212 A | * | 8/1996 | Kunikane et al. | 398/136 |
| 5,555,334 A | * | 9/1996 | Ohnishi et al. | 385/93 |
| 5,751,877 A | * | 5/1998 | Ishizaka et al. | 385/93 |
| 5,974,065 A | * | 10/1999 | Kanda | 372/43 |
| 5,993,073 A | * | 11/1999 | Hamakawa et al. | 385/88 |
| 6,010,251 A | * | 1/2000 | Koyanagi et al. | 385/93 |
| 6,108,359 A | * | 8/2000 | Tatsuta | 372/36 |
| 6,243,508 B1 | * | 6/2001 | Jewell et al. | 385/14 |
| 6,332,721 B1 | * | 12/2001 | Inokuchi | 385/93 |
| 6,650,667 B2 | * | 11/2003 | Nasu et al. | 372/32 |
| 6,665,323 B2 | * | 12/2003 | Fujita | 372/32 |
| 6,704,334 B2 | * | 3/2004 | Yokoyama | 372/29.02 |

FOREIGN PATENT DOCUMENTS

| | | |
|---|---|---|
| JP | 63-116487 | 5/1988 |
| JP | 7-140501 | 6/1995 |
| JP | 9-80274 | 3/1997 |
| JP | 2001-203419 | 7/2001 |

* cited by examiner

Primary Examiner—Minsun Oh Harvey
Assistant Examiner—Tuan N. Nguyen
(74) Attorney, Agent, or Firm—Leydig, Voit & Mayer, Ltd.

(57) ABSTRACT

A laser diode module includes a laser diode device, an optical device like a single lens placed in front of the laser diode device for reflecting front radiation emitted from a front surface of the laser diode device, and a photodiode placed at the back of the laser diode device and displaced from an optical axis of an optical system which includes the laser diode device, for detecting radiation reflected from the optical device.

14 Claims, 4 Drawing Sheets

LASER DIODE MODULE

BACKGROUND OF THE INVENTION

1. Field of the Invention

The present invention relates to a laser diode module including a light-detecting device, such as a photodiode (PD), for monitoring an optical output from a laser diode device, for example, from a semiconductor laser diode.

2. Description of the Background Art

FIG. 10 shows a structure of a laser diode module including a photodiode. Referring to FIG. 10, in general, the laser diode module includes a laser diode (LD) device 1, a photodiode 2, a lens 4, a cover glass 10, a polarizer 11 and a filter 12. An optical fiber having its end 5 is shown in FIG. 10.

In the conventional laser diode module shown in FIG. 10, photodiode 2 is placed on an optical axis 6 at the back of laser diode device 1. Photodiode 2 thus receives back radiation 7 from the rear side of laser diode device 1 to monitor an output of laser diode 1.

A pumping laser (wavelength: 980 or 1480 nm) employed as a light source for exciting a fiber amplifier has a high optical output. It could accordingly occur that the current monitored by photodiode 2 reaches a saturation state or that the optical output exceeds the driving ability of a driver for photodiode 2.

With the purpose of more accurately monitoring the laser output, it is desired that photodiode 2 receives, not the back radiation 7 which is affected by an internal state (lasing state) of the laser module, but reflected radiation 9 of front radiation 8 or scattered radiation from laser diode device 1.

A laser resonator is constituted of two opposing end-surfaces of laser diode device 1 and a reflector (e.g., a fiber grating within the optical fiber). If any environmental change or change of an injection current is caused to the laser resonator (composite resonator including the fiber grating), gain characteristics of laser diode device 1 change and accordingly the fiber grating does not effectively function, and the ratio between an output from the front and an output from the back of laser diode device 1 changes.

A resultant problem in the placement of photodiode 2 receiving back radiation 7 only is that the linear relation between the radiation received by photodiode 2 and the laser output is lost and consequently photodiode 2 does not serve as an output monitor.

In addition, reflected radiation 9 of front radiation 8 alone is insufficient to allow photodiode 2 to have a sufficient signal intensity, resulting in deterioration of the S/N ratio and thus deterioration of controllability of photodiode 2.

SUMMARY OF THE INVENTION

The present invention is made to solve the above-described problems. One object of the present invention is to enable a light-receiving device to serve as an output monitor which receives laser radiation with a sufficient linear relation with an output (front radiation) from the laser.

According to the present invention, a laser diode module includes a laser diode device, an optical device placed in front of the laser diode device for reflecting front radiation emitted from a front surface of the laser diode device, and a light-receiving device placed at the back of the laser diode device and displaced from an optical axis of an optical system including the laser diode device, for receiving reflected radiation from the optical device. The above placement of the light-receiving device allows this device to receieve the reflecting light of front radiation emitted from the front surface of the laser diode device. Thus, accurate monitor of the laser output is possible.

Preferably, the laser diode module further includes a reflection device constituting a laser resonator together with the laser diode device.

According to another aspect of the present invention, a laser diode module includes a laser diode device, an optical device placed in front of the laser diode device for reflecting front radiation emitted from a front surface of the laser diode device, a light-receiving device placed at the back of the optical device and displaced from an optical axis of an optical system including the laser diode device, for receiving reflected radiation from the optical device, and a reflection device constituting a laser resonator together with the laser diode device. In this aspect, also accurate monitor of the laser output is possible.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention are hereinafter described in conjunction with FIGS. 1–9.

First Embodiment

Figure 1:
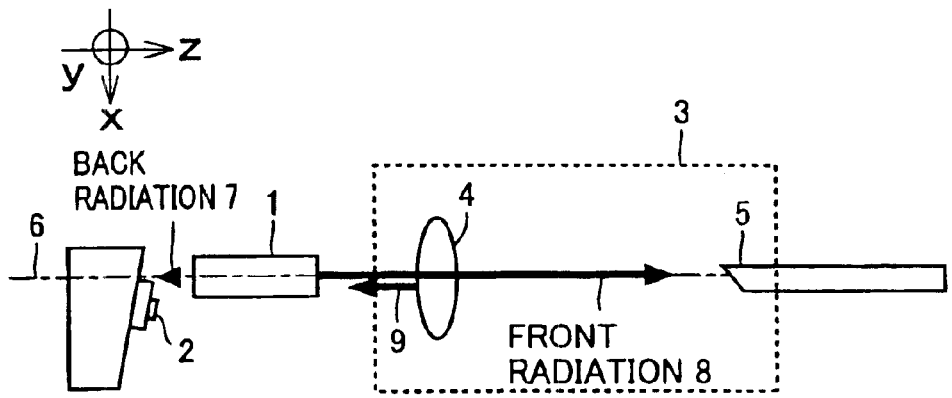
FIGS. 1 to 5 schematically show respective structures of laser diode modules according to first to fifth embodiments of the present invention.

FIG. 1 schematically shows a structure of a laser diode module according to a first embodiment of the present invention. Referring to FIG. 1, the laser diode module of the present invention includes a laser diode device 1 serving as a light-emitting device, a photodiode 2 serving as a light-receiving device, and a coupling optical system 3.

Laser diode device 1 emits not only front radiation (laser radiation) 8 from its front surface but also back radiation (leakage laser radiation) 7 from its back surface. Photodiode 2 is placed at the back of laser diode device 1 and displaced from an optical axis 6 of an optical system which includes laser diode device 1.

Coupling optical system 3 is placed in front of laser diode device 1 and includes such optical devices as a single lens 4 and one end 5 of an optical fiber. The optical devices included in this coupling optical system 3 reflect front radiation 8. Accordingly, photodiode 2 is displaced from optical axis 6 of the above-described optical system which thus includes single lens 4 and optical fiber end 5.

This placement makes it possible to prevent a main component of back radiation 7 from the rear side of laser diode device 1 from entering photodiode 2. On the other hand, front radiation 8 is reflected from single lens (optical device) 4. Resultant reflected radiation (typically partial reflected radiation) 9 spreading at an angle of divergence of the laser diode is thus partially received by photodiode 2 which is displaced from optical axis 6. In other words, according to the first embodiment, photodiode 2 receives, from laser diode device 1, reflected radiation 9 of front radiation 8 that is greater in amount than back radiation 7 which photodiode 2 receives.

In this way, photodiode 2 can monitor reflected radiation 9 which is not affected by the instability of laser diode device 1 that could cause loss of the linearity with respect to laser radiation, i.e., front radiation 8, and which is not affected by gain saturation for example. Photodiode 2 thus accurately monitors the laser output.

Moreover, it is advantageous, for a high-output laser diode like a laser diode for exciting a fiber amplifier, to avoid saturation of an output of photodiode 2. Here, this saturation is caused because photodiode 2 directly receives back radiation 7. From a standpoint to the contrary, the dynamic range of photodiode 2 can advantageously be reduced.

The monitoring is chiefly accomplished by means of reflected radiation 9 of front radiation 8. Then, for a laser resonator having an external reflecting point (reflector) (e.g. composite resonator including a fiber grating), it is advantageous that there is no influence of any change of the external optical feedback effect.

Second Embodiment

Figure 2:
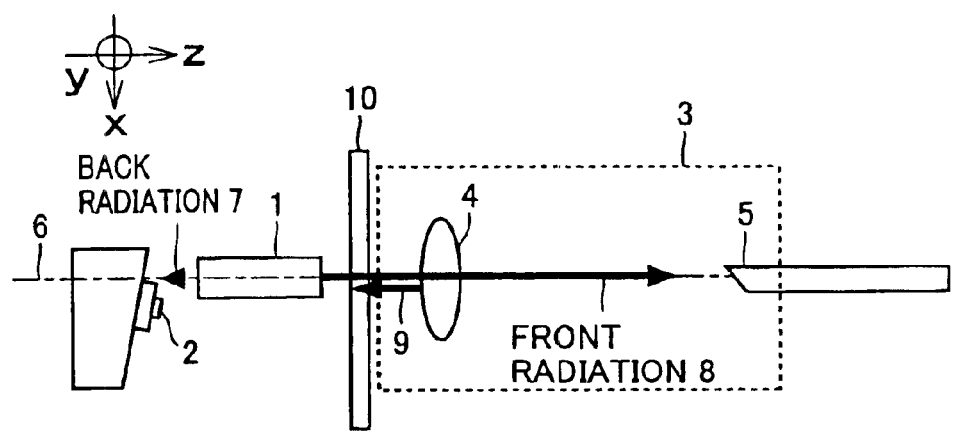

A second embodiment of the present invention is described below. FIG. 2 schematically shows a structure of a laser diode module according to the second embodiment.

Referring to FIG. 2, according to the second embodiment, a cover glass 10 is provided between a laser diode device 1 and a single lens 4. Other components and arrangement of the structure are substantially the same as those of the first embodiment.

Depending on respective reflectances of the end surfaces respectively of single lens 4 and cover glass 10, contribution of reflected radiation 9 to the amount of radiation received by a photodiode 2 varies. In general, respective end surfaces of single lens 4 and cover glass 10 are substantially equal to each other. In this case, since the distance from the laser emission end of laser diode device 1 to cover glass 10 and the distance from photodiode 2 to cover glass 10 are respectively shorter than corresponding distances to single lens 4 and, since the reflection plane of single lens 4 generally bulges in the direction of laser diode device 1, reflected radiation 9 incident on photodiode 2 is mainly the radiation reflected from cover glass 10.

Cover glass 10 is thus added to allow reflected radiation 9 to be received by photodiode 2 in a similar manner to that of the first embodiment and accordingly the same effects as those of the first embodiment are achieved.

Third Embodiment

Figure 3:
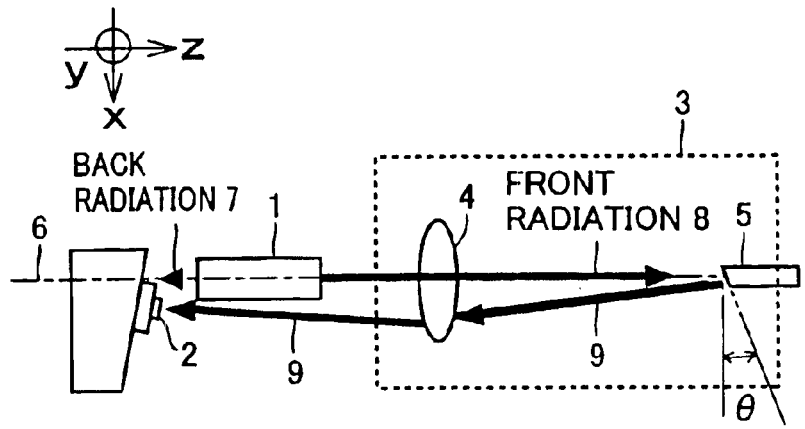

A third embodiment of the present invention is described below. FIG. 3 schematically shows a structure of a laser diode module according to the third embodiment.

An end 5 of an optical fiber (hereinafter "fiber end 5") generally has a large angle of inclination (approximately 8°) for preventing radiation reflected from fiber end 5 from affecting a laser diode device 1 or photodiode 2.

According to the third embodiment, however, the angle of inclination θ of fiber end 5 is made smaller (e.g. approximately 0.5° to 8°). Consequently, as shown in FIG. 3, reflected radiation 9 from fiber end 5 is partially incident on photodiode 2 through a single lens 4.

Generally, respective end surfaces of single lens 4 and fiber end 5 have substantially the same reflectance, or the reflectance of fiber end 5 is relatively higher than that of single lens 4 since no coating is applied to fiber end 5 having a high optical energy density. Additionally, in the vicinity of the point of laser emission from laser diode device 1, the spot size of the reflected radiation from fiber end 5 is substantially the same as that of radiation emitted from laser diode device 1.

Accordingly, the position for example of photodiode 2 may appropriately be adjusted for allowing photodiode 2 to chiefly receive reflected radiation 9 from fiber end 5.

Similar effects to those of the first embodiment are achieved by the third embodiment. Reflected radiation 9 from fiber end 5 is used and the angle of inclination of fiber end 5 is changed. Then, it is possible to independently adjust contribution of reflected radiation 9 to photodiode 2 without making a change in coupling optical system 3 which has influence on the efficiency of emitting laser radiation to the outside of the optical fiber.

Fourth Embodiment

Figure 4:
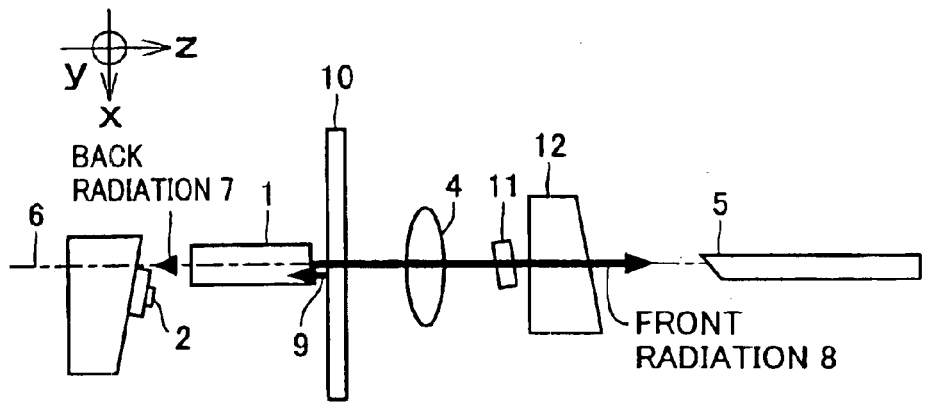

A fourth embodiment of the present invention is described below. FIG. 4 schematically shows a structure of a laser diode module according to the fourth embodiment.

According to the fourth embodiment, as shown in FIG. 4, the module includes optical components like a polarizer 11 and a filter 12. The fourth embodiment thus provides similar effects to those of the second embodiment.

If such polarizer 11 and filter 12 are placed between a single lens 4 and an optical-fiber end 5, these components exert a slight influence on reflected radiation 9. If polarizer 11 and filter 12 are placed between a laser diode device 1 and single lens 4, they have a relatively greater influence on reflected radiation 9. However, the optical components provided between single lens 4 and fiber end 5 or between laser diode device 1 and single lens 4 do not adversely affect reflected radiation 9 and thus substantially the same effects as those of the second embodiment are achieved.

Polarizer 11 and filter 12 for example may be incorporated into any of the laser diode modules of other embodiments as shown in FIGS. 1 and 3 for example. Instead of the single lens employed according to the embodiments described above, any multiple lens like a composite lens may be used. Further, other optical components may be incorporated to achieve similar effects.

Fifth Embodiment

Figure 5:
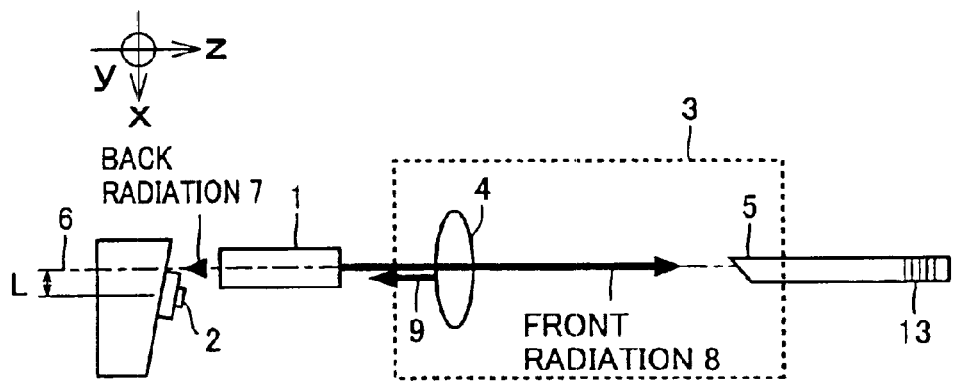

A fifth embodiment of the present invention is described below. FIG. 5 schematically shows a structure of a laser diode module according to the fifth embodiment.

According to the fifth embodiment, a fiber grating 13 is provided within an optical fiber of a laser diode module as shown in FIGS. 1–4 to constitute a composite resonator by two opposing end-surfaces of a laser diode device 1 and fiber grating 13.

Fiber grating 13 is a bandpass filter. Thus, any change in the drive current or ambient temperature changes the gain in central wavelength, or lasing conditions. Accordingly, the resonator shifts between the state of the composite resonator on which fiber grating 13 has a considerable influence and the state of a single resonator without being influenced by fiber grating 13.

Those components except for fiber grating 13 are similar to those of the first to fourth embodiments and accordingly similar effects to those of the embodiments are achieved.

The linearity between back radiation 7 and front radiation 8 emitted from the laser is lost due to any environmental change for example. Then, reflected radiation 9 that accurately represents front radiation 8 can be monitored to precisely monitor the laser output.

Moreover, it is advantageous, for a high-output laser diode like a laser diode for exciting a fiber amplifier, to avoid saturation of an output of photodiode 2 that is caused because photodiode 2 directly receives back radiation 7. From a standpoint to the contrary, the dynamic range of the photodiode 2 can advantageously be reduced.

For a laser resonator having an external reflecting point (reflector) (e.g. composite resonator including fiber grating 13), it is advantageous that there is no influence of any change of the external optical feedback effect.

The module may include such optical components as a polarizer 11 and a filter 12. In this case, those effects similar to the above-described ones are achieved.

Sixth Embodiment

A sixth embodiment of the present invention is described below. Generally, in order to efficiently output radiation from the laser diode module, an optical component (optical device) reflecting radiation to generate reflected radiation 9 is covered with an antireflection coating to adjust the reflectance of the optical component to 1% or less.

Consequently, reflected radiation 9 from the optical component with the reflectance of only 1% or less is received by a photodiode 2. Moreover, because of an increased spot size of light on photodiode 2, the intensity of reflected radiation 9 received by photodiode 2 could be extremely low which results in deterioration the S/N ratio.

Then, according to the sixth embodiment, at least one of a displacement L in the x direction (see FIG. 5) and a displacement in the y direction (not shown) relative to an optical axis 6 of a laser diode 1 is made smaller than the beam spot size of back radiation 7. Accordingly, in addition to reflected radiation 9, back radiation 7 is received partially by photodiode 2 to the extent that the linearity with respect to front radiation 8 is not lost.

It is supposed here that the beam spot size of back radiation 7 on the rear end surface of laser diode 1 is 2 $\mu m \times 0.6$ $\mu m$ and the distance between laser diode 1 and photodiode 2 is approximately 700 $\mu m$. Photodiode 2 is displaced in the x and y directions respectively by 50 $\mu m$ and 400 $\mu m$ from optical axis 6.

Photodiode 2 accordingly receives both of back radiation 7 and front radiation 8, which means that photodiode 2 receives an increased amount of radiation. The S/N ratio is thus improved and controllability is enhanced.

Moreover, the displacements can be adjusted to keep an appropriate ratio between the optical component from the front and the optical component from the back that are received by photodiode 2. The displacements are preferably adjusted in the x and y directions so that the ratio of the front optical component relative to the total amount of radiation received by photodiode 2 is higher than the ratio of the back optical component relative to the total amount of radiation received by photodiode 2 (e.g. the ratio of the front optical component is 60% or higher). Linear output monitor is thus accomplished.

Seventh Embodiment

Figure 6:
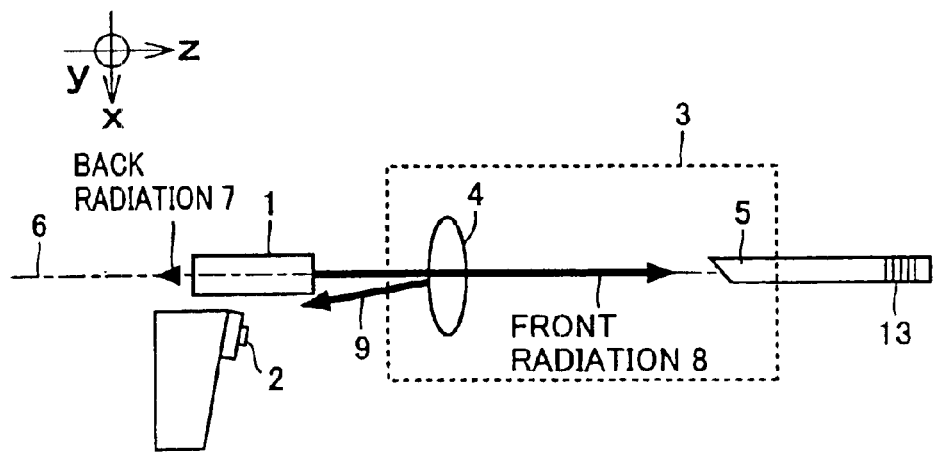
FIG. 6 schematically shows a structure of a laser diode module according to a seventh embodiment of the present invention.

A seventh embodiment of the present invention is described below. FIG. 6 schematically shows a structure of a laser diode module according to the seventh embodiment.

Referring to FIG. 6, according to the seventh embodiment, a photodiode 2 is placed, with respect to the z direction, at a position corresponding to the position of a laser diode 1 or ahead of laser diode 1, not at the back of laser diode 1.

Photodiode 2 is thus located closer to such an optical component as a single lens 4. Then, decrease of the intensity of reflected radiation 9 is compensated for and the S/N ratio is improved.

Eighth Embodiment

An eighth embodiment of the present invention is described below, that is devised to solve a problem caused by decrease of the amount of reflected radiation 9.

An optical component which reflects radiation to generate reflected radiation 9 is covered with a coating so as to adjust the reflectance of the optical component to an appropriate value in a range from 0.5% to 10% under the conditions of an operation range of front radiation 8 and a light-receiving sensitivity of a photodiode 2.

Figure 7:
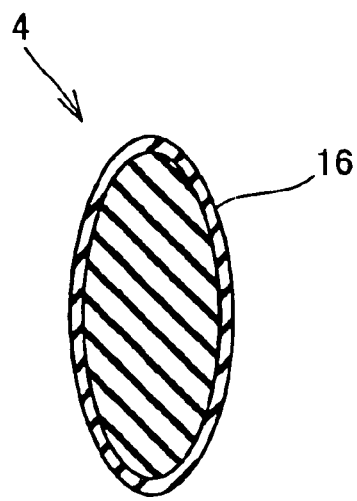
FIG. 7 shows a cross section of a single lens 4 according to an eighth embodiment of the present invention.

Specifically, as shown in FIG. 7, a single lens 4 is covered with a coating layer 16. Coating layer 16 is formed of such a dielectric material as $SiO_2$ or $Al_2O_3$ and has a thickness corresponding approximately to wavelength $\lambda$. The reflectance is then adjusted to several percents.

Alternatively, such an optical component as optical fiber end 5, cover glass 10, polarizer 11 or filter 12 may be covered with a coating to adjust the reflectance of the optical component to an appropriate reflectance.

The optical component itself may be formed of any material having a reflectance from 0.5% to 10%. For example, the optical component may be formed of a generally used glass material having a refractive index of 2% or less.

It is also possible according to the eighth embodiment to increase the amount of reflected radiation 9 reflected from the optical component and thus increase the amount of radiation received by photodiode 2. The S/N ratio is then improved.

Ninth Embodiment

Figure 8:
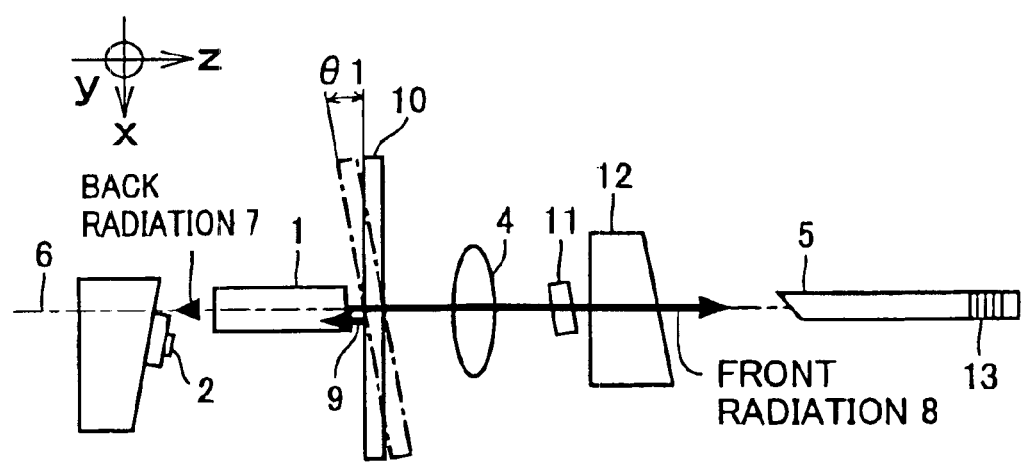
FIGS. 8 and 9 schematically show respective structures of laser diode modules according to ninth and eleventh embodiments of the present invention.

A ninth embodiment of the present invention is described below. FIG. 8 schematically shows a structure of a laser diode module according to the ninth embodiment.

According to the ninth embodiment, an optical component reflecting front radiation 8 is inclined with respect to an optical axis 6 so as to optimize the amount of reflected radiation 9 received by a photodiode 2. In the example shown in FIG. 8, a cover glass 10 is inclined by angle $\theta 1$ with respect to the perpendicular to optical axis 6. Here, the angle of inclination $\theta 1$ is approximately in the range from 0° to 45° for example.

Reflected radiation 9 is thus surely incident on a desired part of photodiode 2 to optimize the amount of radiation received by photodiode 2. Consequently, photodiode 2 receives an increased amount of radiation which enhances the S/N ratio.

Another optical component like a polarizer 11 or filter 12 for example may be inclined. In addition, the plane of inclination of the optical component may be inclined with respect to optical axis 6 to allow photodiode 2 to receive reflected radiation 9.

Tenth Embodiment

A tenth embodiment of the present invention is described below. According to the tenth embodiment, the shape of a light-receiving part of a photodiode 2 is optimized so as to efficiently receive reflected radiation 9. Specifically, a shape of the light-receiving part of photodiode 2 is selected according to a beam pattern of the laser diode. More specifically, the light-receiving part of photodiode 2 is shaped to match the shape of a far-field pattern of a beam of reflected radiation 9.

If the shape of the beam of reflected radiation 9 is an ellipse having different dimensions in the x and y directions respectively, which is a relatively general shape of a laser diode beam pattern, the light-receiving part of photodiode 2 is made elliptical in shape or shaped into a rectangle having longer and shorter sides that are equivalent respectively to the major and minor axes of the ellipse as described above. Here, the rectangle is closer in shape to the ellipse. In this case, the amount of radiation received by photodiode 2 increases and thus the S/N ratio is improved.

Eleventh Embodiment

Figure 9:
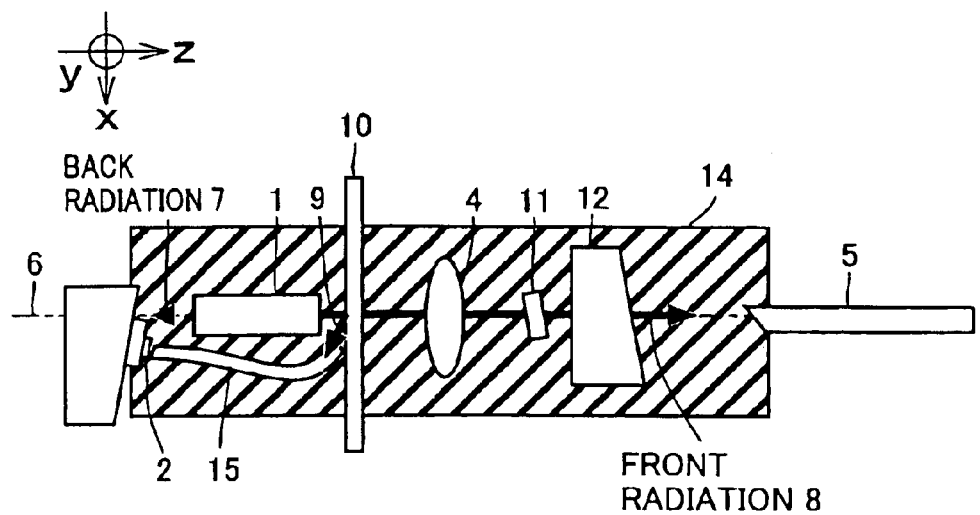
Figure 10:
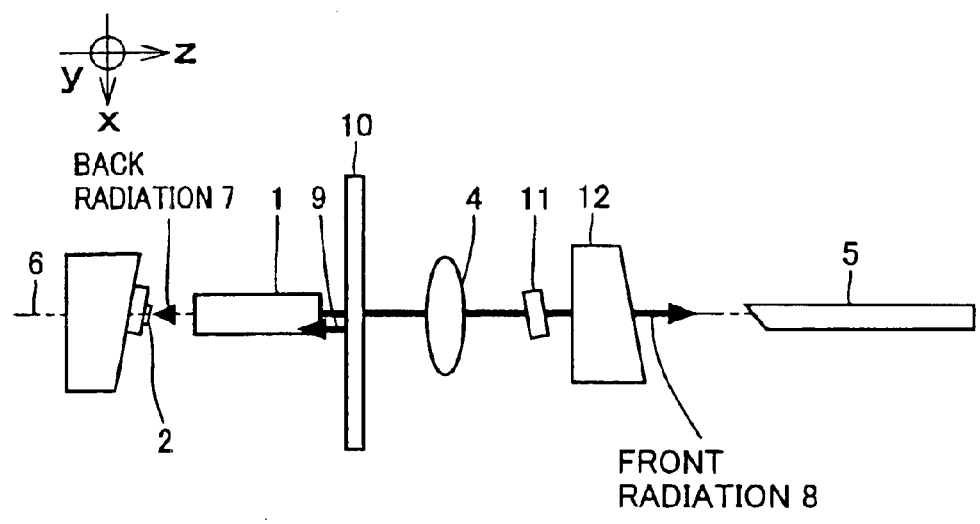
FIG. 10 schematically shows a structure of a conventional laser diode module.

An eleventh embodiment of the present invention is described below. FIG. 9 schematically shows a structure of a laser diode module according to the eleventh embodiment.

According to the eleventh embodiment, a PBG (photonic band gap) crystal 14 having a PBG structure is provided around a laser diode device 1 to incorporate therein a linear defect 15 of the PBG structure along the path extending from such optical devices as an optical-fiber end 5, a cover glass 10, a polarizer 11 and a filter 12 to photodiode 2. This linear defect 15 can be provided by removing only the part having a waveguide structure in the periodical structure of the photonic crystal that is uniformly formed. At this time, the periodical structure of PBG crystal 14 is determined to allow an emission wavelength of laser diode device 1 to match the PBG band.

In this way, owing to characteristics of this PBG structure, reflected radiation 9 is directed through only the linear defect 15 in the PBG structure. In other words, linear defect 15 serves as a waveguide or director of reflected radiation 9.

Consequently, reflected radiation 9 from at least one optical device is guided without loss in theory to photodiode 2 which accordingly receives an increased amount of radiation, and the S/N radio is improved.

Embodiments of the present invention are heretofore described. It is originally intended that any characteristics of the embodiments are appropriately combined.

According to the present invention, the light-receiving device chiefly receives reflected radiation of front radiation emitted from the front surface of the laser diode device, and thus accurately monitors a laser output. Accordingly, the light-receiving device functions as an output monitor while keeping a sufficient linearity relative to the laser output.

Moreover, the amount of radiation received by the light-receiving device is increased by allowing the light-receiving device to additionally receive the back radiation from the laser diode device, for example. Then, shortage of the signal intensity of the light-receiving device is avoided and thus deterioration in the S/N ratio as well as the controllability of the light-receiving device is prevented.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A laser diode module comprising:

a laser diode device generating radiation, having an optical axis, a front surface through which front radiation is emitted, and a back surface through which back radiation is emitted;

an optical device having an optical axis coaxial with the optical axis of said laser diode device, located opposite the front surface of said laser diode device, and reflecting some of the front radiation emitted from the front surface of said laser diode device; and a light-detecting device located proximate the back surface of said laser diode device and displaced from the optical axis of said laser diode device, for detecting a part of the front radiation reflected from said optical device and a part of the back radiation, the part of the front radiation detected by said light-detecting device exceeding in amount the part of the back radiation detected by said light-detecting device.

2. The laser diode module according to claim 1, wherein said optical device includes a wavelength selective reflector forming a composite resonator with the front and rear surfaces of said laser diode device.

3. The laser diode module according to claim 2, wherein said optical device includes an optical fiber and said wavelength selective resonator includes a fiber grating within the optical fiber.

4. The laser diode module according to claim 1, wherein the back radiation forms a beam having a spot size varying with distance from the back surface of said laser diode device and said light-detecting device is displaced from the optical axis of said laser diode device by a distance smaller than the spot size of the back radiation at the location of said light-detecting device.

5. The laser diode module according to claim 1, wherein said optical device has a reflectance of 0.5% to 10%.

6. The laser diode module according to claim 1, wherein said light-detecting device has a light-detecting part shaped to correspond to a far-field pattern of a beam of the front radiation reflected.

7. The laser diode module according to claim 1, wherein the part of the front radiation detected by said light-detecting device is at least 60% of the radiation detected by said light-detecting device.

8. A laser diode module comprising:

a laser diode device generating radiation, having an optical axis, a front surface through which front radiation is emitted, and a back surface through which back radiation is emitted;

an optical device having an optical axis coaxial with the optical axis of said laser diode device, located opposite the front surface of said laser diode device, and reflecting some of the front radiation emitted from the front surface of said laser diode device;

a light-detecting device located proximate the back surface of said laser diode device and displaced from the optical axis of said laser diode device, for detecting a part of the front radiation reflected from said optical device and a part of the back radiation; and a photonic crystal, wherein said laser diode device and said optical device are enclosed by said photonic crystal, said photonic crystal having a photonic band-gap structure, and including a waveguide located along a path extending from a reflection surface of said optical device to said light-detecting device, said waveguide including a linear defect in said photonic crystal.

9. A laser diode module comprising:

a laser diode device generating radiation, having an optical axis, a front surface through which front radiation is emitted, and a back surface through which back radiation is emitted;

an optical device having an optical axis not coaxial with the optical axis of said laser diode device, located opposite the front surface of said laser diode device, and reflecting some of the front radiation emitted from the front surface of said laser diode device; and a light-detecting device located proximate the back surface of said laser diode device and displaced from the optical axis of said laser diode device, for detecting a part of the front radiation reflected from said optical device and a part of the back radiation, the part of the front radiation detected by said light-detecting device exceeding in amount the part of the back radiation detected by said light-detecting device.

10. The laser diode module according to claim 9, wherein the optical axis of said optical device is inclined with respect to the optical axis of said laser diode device for reflecting the part of the front radiation detected by said light-detecting device.

11. The laser diode module according to claim 9, wherein the back radiation forms a beam having a spot size varying with distance from the back surface of said laser diode device and said light-detecting device is displaced from the optical axis of said laser diode device by a distance smaller than the spot size of the back radiation at the location of said light-detecting device.

12. The laser diode module according to claim 9, wherein said optical device has a reflectance of 0.5% to 10%.

13. The laser diode module according to claim 9, wherein said light-detecting device has a light-detecting part shaped to correspond to a far-field pattern of a beam of the front radiation reflected.

14. The laser diode module according to claim 9, wherein the part of the front radiation detected by said light-detecting device is at least 60% of the radiation detected by said light-detecting device.

* * * * *